(12) United States Patent
Hao

(10) Patent No.: US 10,971,617 B2
(45) Date of Patent: Apr. 6, 2021

(54) SEMICONDUCTOR DEVICE AND MANUFACTURING METHOD THEREOF

(71) Applicant: INNOSCIENCE (ZHUHAI) TECHNOLOGY CO., LTD., Zhuhai (CN)

(72) Inventor: Ronghui Hao, Zhuhai (CN)

(73) Assignee: INNOSCIENCE (ZHUHAI) TECHNOLOGYCO., LTD., Zhuhai (CN)

(*) Notice: Subject to any disclaimer, the term of this patent is extended or adjusted under 35 U.S.C. 154(b) by 0 days.

(21) Appl. No.: 16/729,579

(22) Filed: Dec. 30, 2019

(65) Prior Publication Data

US 2021/0074837 A1 Mar. 11, 2021

(30) Foreign Application Priority Data

Sep. 10, 2019 (CN) .......................... 201910855069.5

(51) Int. Cl.
| | | |
|---|---|---|
| H01L 29/778 | (2006.01) | |
| H01L 29/205 | (2006.01) | |
| H01L 29/20 | (2006.01) | |
| H01L 27/06 | (2006.01) | |
| H01L 27/092 | (2006.01) | |
| H01L 29/66 | (2006.01) | |

(52) U.S. Cl.
CPC ...... *H01L 29/7787* (2013.01); *H01L 27/0605* (2013.01); *H01L 27/092* (2013.01); *H01L 29/2003* (2013.01); *H01L 29/205* (2013.01); *H01L 29/66462* (2013.01); *H01L 29/7781* (2013.01); *H01L 29/7782* (2013.01); *H01L 29/7783* (2013.01); *H01L 29/7784* (2013.01)

(58) Field of Classification Search
CPC .................................................. H01L 29/7785
See application file for complete search history.

(56) References Cited

U.S. PATENT DOCUMENTS

| | | | | |
|---|---|---|---|---|
| 8,067,788 B2* | 11/2011 | Bito | ................... | H01L 29/1066 257/192 |
| 10,002,956 B1* | 6/2018 | Lin | ................... | H01L 29/66462 |
| 10,886,381 B2* | 1/2021 | Huang | ............... | H01L 27/0605 |
| 2007/0164315 A1* | 7/2007 | Smith | ................. | H01L 29/7787 257/194 |
| 2013/0056746 A1* | 3/2013 | Joshin | ................ | H01L 29/7786 257/76 |

OTHER PUBLICATIONS

Hahn, Herwig "p-Channel Enhancement and Depletion Mode GaN-Based HFETs with Quaternary Backbarriers" IEEE Trans. on Elec. Dev. vol. 60, No. 10 Oct. 2013 pp. 3005-3011 (Year: 2013).*

(Continued)

*Primary Examiner* — Grant S Withers
(74) *Attorney, Agent, or Firm* — Idea Intellectual Limited; Margaret A. Burke; Sam T. Yip

(57) ABSTRACT

Some embodiments of this disclosure provide a semiconductor device. The semiconductor device includes: a substrate; a barrier layer, disposed on the substrate; a first channel layer, disposed on the barrier layer; a first gate conductor, disposed on the first channel layer; and a first doped semiconductor layer, disposed between the first gate conductor and the first channel layer, where a forbidden band width of the barrier layer is greater than a forbidden band width of the first channel layer.

11 Claims, 9 Drawing Sheets

(56) References Cited

OTHER PUBLICATIONS

Rongming Chu et. al., "An Experimental Demonstration of GaN CMOS Technology", IEEE Electron Device Letters, vol. 37, Issue: 3, Mar. 2016, p. 1-4.
Fu Chen et. al., "Enhancement-mode n-GaN gate p-channel heterostructure field effect transistors based on GaN/AlGaN 2D hole gas", Applied Physics Letters, 115(11), 2019, p. 1-11.

* cited by examiner

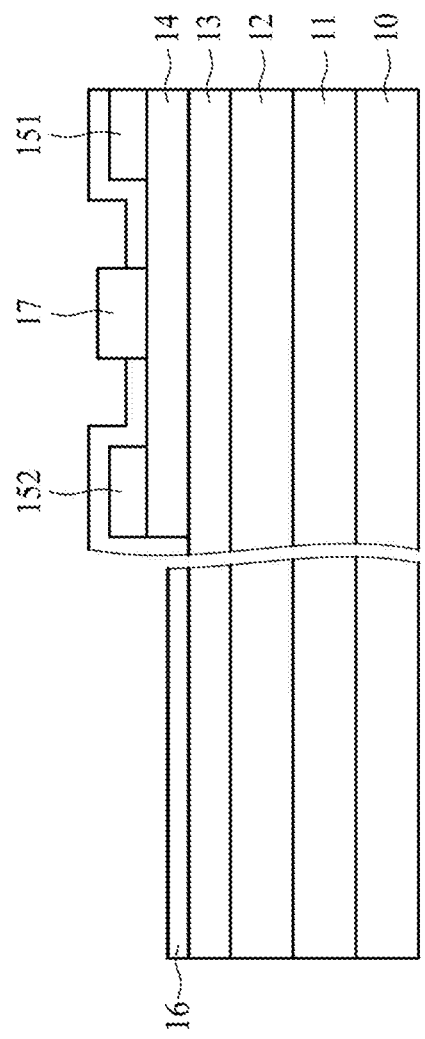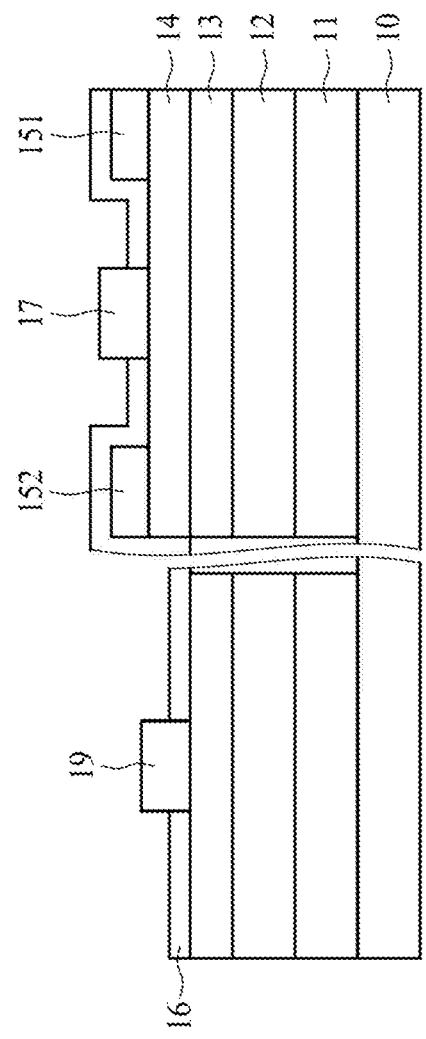

SEMICONDUCTOR DEVICE AND MANUFACTURING METHOD THEREOF

CROSS REFERENCE TO RELATED APPLICATIONS

The present application claims the benefit of priority from the China Patent Application No. 201910855069.5, filed on 10 Sep. 2019, the disclosure of which is hereby incorporated by reference in its entirety.

BACKGROUND

1. Field of the Application

This disclosure relates to a semiconductor device, and in particular, to a complementary metal-oxide-semiconductor (CMOS) device.

2. Description of the Related Art

A component that includes a direct bandgap semiconductor, for example, a semiconductor component that includes a category-III-V material or a category-III-V compound can operate or work in various conditions or environments (for example, under different voltages or frequencies) due to their properties.

Such semiconductor components may include a heterojunction bipolar transistor (HBT), a heterojunction field effect transistor (HFET), a high-electron-mobility transistor (HEMT), or a modulated-doped field effect transistor (MODFET), and the like.

SUMMARY

Some embodiments of this disclosure provide a semiconductor device. The semiconductor device includes: a substrate; a barrier layer disposed on the substrate; a first channel layer, disposed on the barrier layer; a first gate conductor, disposed on the first channel layer; and a first doped semiconductor layer, disposed between the first gate conductor and the first channel layer, where a forbidden band width of the barrier layer is greater than a forbidden band width of the first channel layer.

BRIEF DESCRIPTION OF THE DRAWINGS

The aspects of this disclosure will become more comprehensible from the specific embodiments with reference to the accompanying drawings. It should be noted that, various features may not be drawn to scale. Actually, the sizes of the various features may be increased or reduced arbitrarily for the purpose of clear description.

FIG. 4A, FIG. 4B, FIG. 4C, FIG. 4D, FIG. 4E, FIG. 4F, and FIG. 4G illustrate several operations of fabricating a semiconductor device according to some embodiments of this disclosure.

PREFERRED EMBODIMENT OF THE PRESENT APPLICATION

Figure 1:
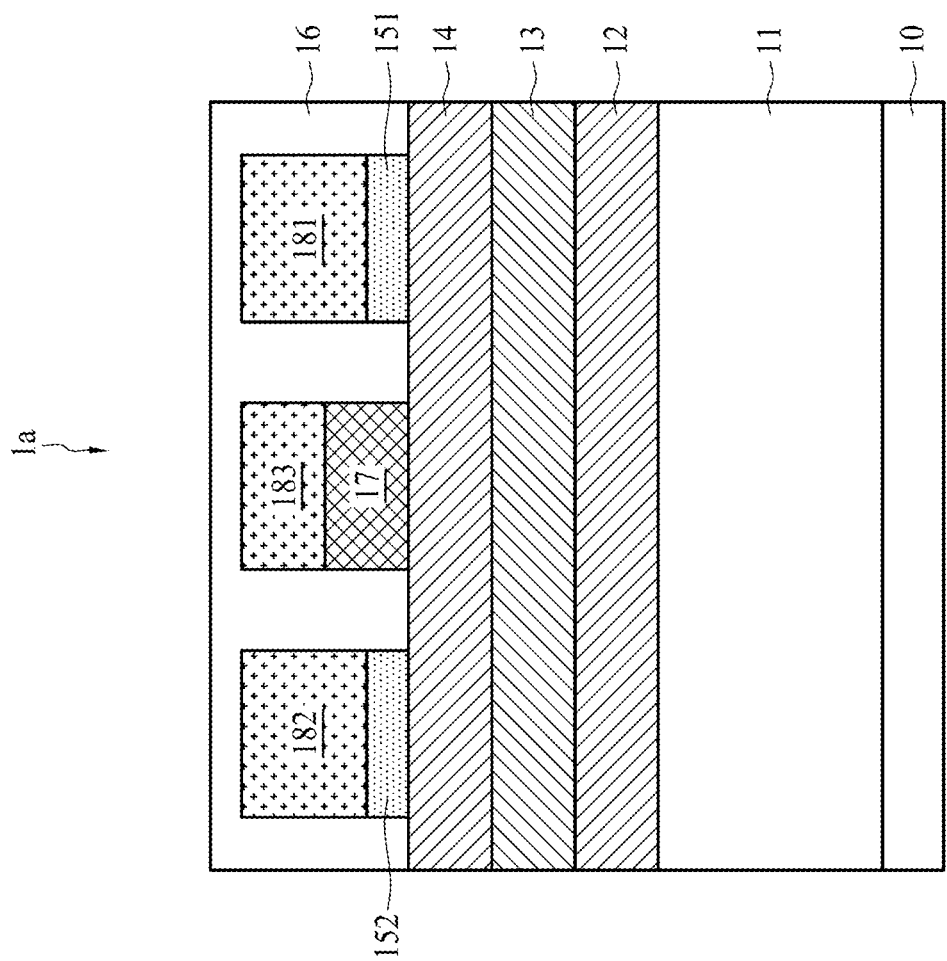
FIG. 1 is a side view of a semiconductor device according to some embodiments of this disclosure.

The following disclosed content provides many different embodiments or examples of different features used to implement the provided subject matters. The following describes specific examples of components and deployments. Certainly, there are merely examples and are not intended to be limitative. In this disclosure, in the following descriptions, reference formed by the first feature above or on the second feature may include an embodiment formed by direct contact between the first feature and the second feature, and may further include an embodiment in which an additional feature may be formed between the first feature and the second feature to enable the first feature and the second feature to be not in direct contact. In addition, in this disclosure, reference numerals and/or letters may be repeated in examples. This repetition is for the purpose of simplification and clarity, and does not indicate a relationship between the described various embodiments and/or configurations.

The embodiments of this disclosure are described in detail below. However, it should be understood that many applicable concepts provided by this disclosure may be implemented in a plurality of specific environments. The described specific embodiments are only illustrative and do not limit the scope of this disclosure.

Direct bandgap materials, such as category-III-V compounds, may include but are not limited to, gallium arsenide (GaAs), indium phosphide (InP), gallium nitride (GaN), indium gallium arsenide (InGaAs), aluminum gallium arsenide (InAlAs), and the like.

FIG. 1 is a side view of a semiconductor device 1a according to some embodiments of this disclosure.

As shown in FIG. 1, a structure 1a may include a substrate 10, a buffer layer 11, a semiconductor layer 12, a semiconductor layer 13, a semiconductor layer 14, a doped semiconductor layer 151, a doped semiconductor layer 152, a passivation layer 16, and a doped semiconductor layer 17, a conductive structure 181, a conductive structure 182, and a conductive structure 183.

The substrate 10 may include, but without limitation, silicon (Si), doped silicon (doped Si), silicon carbide (SiC), silicon germanium (SiGe), gallium arsenide (GaAs), or other semiconductor materials. The substrate 102 may include, but without limitation, sapphire, silicon on insulator (SOI), or other appropriate materials. In some embodiments, the substrate 102 may further include a doped region (not shown in FIG. 1), such as a p-well, or an n-well.

The buffer layer 11 may be disposed on the substrate 10. In some embodiments, the buffer layer 11 may include nitrides. In some embodiments, the buffer layer 11 may include, but without limitation, aluminum nitride (AlN). In some embodiments, the buffer layer 11 may include, but without limitation, aluminum gallium nitride (AlGaN). The buffer layer 11 may include a multilayer structure. The buffer layer 11 may include a single-layer structure.

The semiconductor layer 12 may be disposed on the buffer layer 11. The semiconductor layer 12 may include a category-III-V material. The semiconductor layer 12 may include, but without limitation, a category-III nitride. The semiconductor layer 12 may include, but without limitation, GaN. The semiconductor layer 12 may include, but without limitation, AlN. The semiconductor layer 12 may include, but without limitation, InN. The semiconductor layer 12 may include, but without limitation, a compound $In_xAl_yGa_{1-x-y}N$, where $x+y\leq 1$. The semiconductor layer 12 may include, but without limitation, a compound $Al_yGa_{(1-y)}N$, where $y\leq 1$.

The semiconductor layer 13 may be disposed on the semiconductor layer 12. The semiconductor layer 13 may include a category-III-V material. The semiconductor layer 13 may include, but without limitation, a category-III nitride. The semiconductor layer 13 may include, but without limitation, GaN. The semiconductor layer 13 may include, but without limitation, AlN. The semiconductor layer 13 may include, but without limitation, InN. The semiconductor layer 13 may include, but without limitation, a compound $In_xAl_yGa_{1-x-y}N$, where $x+y\leq 1$. The semiconductor layer 13 may include, but without limitation, a compound $Al_yGa_{(1-y)}N$, where $y\leq 1$.

A heterojunction may be formed between the semiconductor layer 13 and the semiconductor layer 12. The semiconductor layer 13 may have a bandgap that is larger than a bandgap of the semiconductor layer 12. For example, the semiconductor layer 13 may include AlGaN, and the AlGaN may have a bandgap of approximately 4 eV. The semiconductor layer 12 may include GaN, and the GaN may have a bandgap of approximately 3.4 eV.

The semiconductor layer 14 may be disposed on the semiconductor layer 13. The semiconductor layer 14 may include a category-III-V material. The semiconductor layer 14 may include, but without limitation, a category-III nitride. The semiconductor layer 14 may include, but without limitation, GaN. The semiconductor layer 14 may include, but without limitation, AN. The semiconductor layer 14 may include, but without limitation, InN. The semiconductor layer 14 may include, but without limitation, a compound $In_xAl_yGa_{1-x-y}N$, where $x+y\leq 1$. The semiconductor layer 14 may include, but without limitation, a compound $Al_yGa_{(1-y)}N$, where $y\leq 1$.

A heterojunction may be formed between the semiconductor layer 14 and the semiconductor layer 13. The semiconductor layer 14 may have a smaller bandgap than that of the semiconductor layer 13. For example, the semiconductor layer 14 may include GaN, and the GaN may have a bandgap of approximately 3.4 eV. The semiconductor layer 13 may include AlGaN, and the AlGaN may have a bandgap of approximately 4 eV.

The doped semiconductor layer 151 may be disposed on the semiconductor layer 14. The doped semiconductor layer 151 may include a doped category-III-V material. The doped semiconductor layer 151 may include a p-type category-III-V material. The doped semiconductor layer 151 may include, but without limitation, a p-type category-III nitride. The doped semiconductor layer 151 may include, but without limitation, a p-type GaN. The doped semiconductor layer 151 may include, but without limitation, a p-type AlN. The doped semiconductor layer 151 may include, but without limitation, a p-type InN. When the doped semiconductor layer 151 includes a p-type category-III-V material, the doped material of the doped semiconductor layer 151 may include, but without limitation, at least one of Mg, Zn, or Ca.

The doped semiconductor layer 152 may be disposed on the semiconductor layer 14. The doped semiconductor layer 152 may include a doped category-III-V material. The doped semiconductor layer 152 may include a p-type category-III-V material. The doped semiconductor layer 152 may include, but without limitation, a p-type category-III nitride. The doped semiconductor layer 152 may include, but without limitation, a p-type GaN. The doped semiconductor layer 152 may include, but without limitation, a p-type AlN. The doped semiconductor layer 152 may include, but without limitation, a p-type InN. When the doped semiconductor layer 152 includes a p-type category-III-V material, the doped material of the doped semiconductor layer 152 may include, but without limitation, at least one of Mg, Zn, or Ca.

The doped semiconductor layer 17 may be disposed on the semiconductor layer 14. The doped semiconductor layer 17 may include a doped category-III-V material. The doped semiconductor layer 17 may include an n-type category-III-V material. The doped semiconductor layer 17 may include, but without limitation, an n-type category-III nitride. The doped semiconductor layer 17 may include, but without limitation, an n-type GaN. The doped semiconductor layer 17 may include, but without limitation, an n-type AlN. The doped semiconductor layer 17 may include, but without limitation, an n-type InN. The doped semiconductor layer 17 may include, but without limitation, an n-type AlGaN. The doped semiconductor layer 17 may include, but without limitation, an n-type InGaN. The doped semiconductor layer 17 may include, but without limitation, an n-type InAlN. The doped semiconductor layer 17 may include, but without limitation, an n-type AlInGaN. When the doped semiconductor layer 17 includes an n-type category-III-V material, the doped material of the doped semiconductor layer 17 may include, but without limitation, at least one of Si or Ge.

The doped semiconductor layer 17 may also include another n-type semiconductor material. The doped semiconductor layer 17 may include, but without limitation, an n-type $Ga_2O_3$. The doped semiconductor layer 17 may include, but without limitation, an n-type SiC. When the doped semiconductor layer 17 includes an n-type $Ga_2O_3$, the doped material of the doped semiconductor layer 17 may include, but without limitation, at least one of Si or Ge. When the doped semiconductor layer 17 includes an n-type SiC, the doped material of the doped semiconductor layer 17 may include, but without limitation, at least one of Si or Ge.

The doped semiconductor layer 17 may have a thickness of approximately 5 nm to approximately 200 nm. The doped semiconductor layer 17 may have a thickness of approximately 50 nm to approximately 150 nm. The doped semiconductor layer 17 may have a thickness of approximately 80 nm to approximately 120 nm. The doped semiconductor layer 17 may have a doping concentration of approximately $10^{17}$ cm$^{-3}$ to approximately $10^{21}$ cm$^{-3}$. The doped semiconductor layer 17 may have a doping concentration of approximately $10^{19}$ cm$^{-3}$ to approximately $10^{21}$ cm$^{-3}$. The doped semiconductor layer 17 may have a doping concentration of approximately $10^{20}$ cm$^{-3}$ to approximately $10^{21}$ cm$^{-3}$.

The conductive structure 181 may be disposed on the semiconductor layer 14. The conductive structure 181 may be disposed on the doped semiconductor layer 151 so that the doped semiconductor layer 151 is located between the semiconductor layer 14 and the conductive structure 181. The conductive structure 181 may include a metal. The conductive structure 181 may include, but without limitation, gold (Au), platinum (Pt), palladium (Pd), nickel (Ni), and tungsten (W). The conductive structure 181 may include a metal compound. The conductive structure 181 may include, but without limitation, titanium nitride (TiN), tantalum nitride (TaN), and tungsten carbide (WC).

The conductive structure 182 may be disposed on the semiconductor layer 14. The conductive structure 182 may be disposed on the doped semiconductor layer 152 so that the doped semiconductor layer 152 is located between the semiconductor layer 14 and the conductive structure 182. The conductive structure 181 may include a metal. The conductive structure 181 may include, but without limitation, gold (Au), platinum (Pt), palladium (Pd), nickel (Ni), and tungsten (W). The conductive structure 181 may include a metal compound. The conductive structure 181 may include, but without limitation, titanium nitride (TiN), tantalum nitride (TaN), and tungsten carbide (WC).

The conductive structure 183 may be disposed on the semiconductor layer 14. The conductive structure 183 may be disposed on the doped semiconductor layer 17 so that the doped semiconductor layer 17 is located between the semiconductor layer 14 and the conductive structure 183.

The conductive structure 183 may include a metal. The conductive structure 183 may include, but without limitation, gold (Au), platinum (Pt), palladium (Pd), nickel (Ni), tungsten (W), and tantalum (Ta). The conductive structure 183 may include a metal compound. The conductive structure 183 may include, but without limitation, titanium nitride (TiN), tantalum nitride (TaN), and tungsten carbide (WC).

The conductive structure 181 may serve as a source conductor of the semiconductor device. The conductive structure 182 may serve as a drain conductor of the semiconductor device. The conductive structure 183 may serve as a gate conductor of the semiconductor device. The conductive structure 181 usable as a source conductor and the conductive structure 182 usable as a drain conductor are separately disposed on two sides of the conductive structure 183 usable as a gate conductor in FIG. 1, but the conductive structure 181, the conductive structure 182, and the conductive structure 183 may have different configurations in other embodiments of this disclosure depending on design requirements.

The structure 1a may also include a passivation layer 16. The passivation layer 16 may be disposed on the semiconductor layer 14. The passivation layer 16 may be located between the doped semiconductor layer 151 and the doped semiconductor layer 17. The passivation layer 16 may be located between the doped semiconductor layer 152 and the doped semiconductor layer 17. The passivation layer 16 may be located between the conductive structure 181 and the conductive structure 183. The passivation layer 16 may be located between the conductive structure 182 and the conductive structure 183. The passivation layer 16 may include a dielectric material. The passivation layer 16 may include, but without limitation, silicon nitride (SiNx). The passivation layer 16 may include, but without limitation, silicon dioxide ($SiO_2$). The passivation layer 16 may include, but without limitation, $Al_2O_3$. The passivation layer 16 may include, but without limitation, $HfO_2$.

Figure 2A:
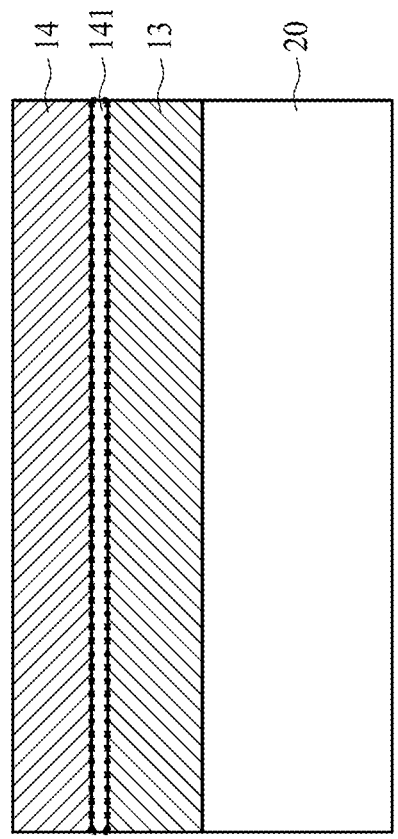
FIG. 2A is a side view of a part of a semiconductor device according to some embodiments of this disclosure.

FIG. 2A is a side view of a part of a semiconductor device according to some embodiments of this disclosure.

As shown in FIG. 2A, a carrier 20 may include the substrate 10, the buffer layer 11, and the semiconductor layer 12 shown in FIG. 1. The carrier 20 may be used to carry a semiconductor device disposed thereon. The carrier 20 may be configured at least to carry a semiconductor layer 13 and a semiconductor layer 14 disposed thereon.

The semiconductor layer 13 may be disposed on the carrier 20.

The semiconductor layer 14 may be disposed on the carrier 20. The semiconductor layer 14 may be disposed on the semiconductor layer 13. The semiconductor layer 14 may be disposed on the semiconductor layer 13 so that the semiconductor layer 13 is located between the carrier 20 and the semiconductor layer 14. The semiconductor layer 14 may be formed after the semiconductor layer 13. The material of the semiconductor layer 14 may be different from that of the semiconductor layer 13. A heterojunction may be formed between the semiconductor layer 14 and the semiconductor layer 13. The semiconductor layer 14 may have a smaller bandgap than that of the semiconductor layer 13. For example, the semiconductor layer 14 may include GaN, and the GaN may have a bandgap of approximately 3.4 eV; and the semiconductor layer 13 may include AlGaN, and the AlGaN may have a bandgap of approximately 4 eV. For example, the semiconductor layer 14 may include InN, and the InN may have a bandgap of approximately 1.97 eV; and the semiconductor layer 13 may include AlN, and the AlN may have a bandgap of approximately 6 eV. Because the bandgap of the semiconductor layer 14 is smaller than that of the semiconductor layer 13, and because the semiconductor layer 14 is formed after the semiconductor layer 13, polarization of the heterojunction may form a two-dimensional hole gas (2DHG) 141 in the semiconductor layer 14 that has a relatively small bandgap. Because the bandgap of the semiconductor layer 14 is smaller than that of the semiconductor layer 13, the polarization of the heterojunction may form a 2DHG 141 in the semiconductor layer 14 with a relatively small bandgap and close to a junction between the semiconductor layer 14 and the semiconductor layer 13.

Figure 2C:
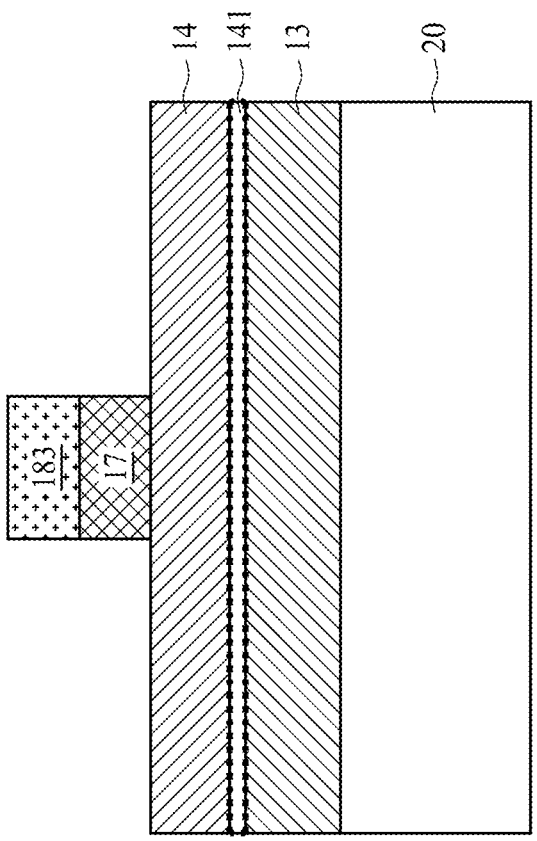
FIG. 2C is a side view of a part of a semiconductor device according to some embodiments of this disclosure.
Figure 2B:
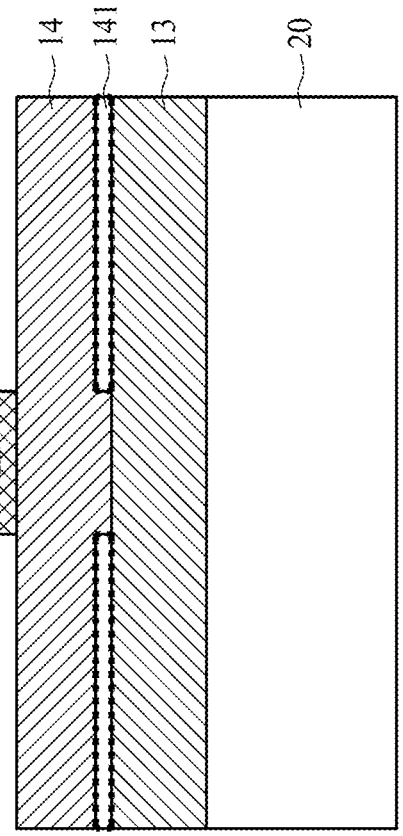
FIG. 2B is a side view of a part of a semiconductor device according to some embodiments of this disclosure.

FIG. 2B is a side view of a part of a semiconductor device according to some embodiments of this disclosure.

The structure shown in FIG. 2B is similar to the structure shown in FIG. 2A, but further includes a doped semiconductor layer 17 and a conductive structure 183 that are disposed over the carrier 20.

The doped semiconductor layer 17 may be disposed on the semiconductor layer 14. The doped semiconductor layer 17 may be disposed between the semiconductor layer 14 and the conductive structure 183. The doped semiconductor layer 17 may include an n-type semiconductor material. The doped semiconductor layer 17 may include an n-type category-III-V material.

When no voltage is applied to the conductive structure 183 (when V1 is substantially zero or a ground voltage level), the doped semiconductor layer 17 may cause depletion of the 2DHG 141 under the conductive structure 183. When no voltage is applied to the conductive structure 183 (when V1 is substantially zero or a ground voltage level), the doped semiconductor layer 17 may cause depletion of the 2DHG 141 that is located under the conductive structure 183 and in the semiconductor layer 14. When no voltage is applied to the conductive structure 183 (when V1 is substantially zero or a ground voltage level), the doped semiconductor layer 17 may cause absence of the 2DHG 141 under the conductive structure 183. When no voltage is applied to the conductive structure 183 (when V1 is substantially zero or a ground voltage level), the doped semiconductor layer 17 may cause blocking of the 2DHG 141 in the semiconductor layer 14.

When the voltage applied to the conductive structure 183 is less than a threshold (|V1|<|Vth|), the doped semiconductor layer 17 may cause depletion of the 2DHG 141 under the conductive structure 183. When the voltage applied to the conductive structure 183 is less than a threshold (|V1|<|Vth|), the doped semiconductor layer 17 may cause depletion of the 2DHG 141 that is under the conductive structure 183 and in the semiconductor layer 14. When the voltage applied to the conductive structure 183 is less than a threshold (|V1|<|Vth|), the doped semiconductor layer 17 may cause absence of the 2DHG 141 under the conductive structure 183. When the voltage applied to the conductive structure 183 is less than a threshold (|V1|<|Vth|), the doped semiconductor layer 17 may cause blocking of the 2DHG 141 in the semiconductor layer 14.

FIG. 2C is a side view of a part of a semiconductor device according to some embodiments of this disclosure.

The structure shown in FIG. 2C is similar to the structure shown in FIG. 2B, but differs in that the voltage V2 applied to the conductive structure 183 is different from V1 shown in FIG. 2B.

When the voltage applied to the conductive structure 183 is greater than or equal to a threshold (|V2|≥|Vth|), the doped semiconductor layer 17 may cause recovery of the 2DHG under the conductive structure 183. When the voltage applied to the conductive structure 183 is greater than or equal to a threshold (|V2|≥|Vth|), the doped semiconductor layer 17 may cause recovery of the 2DHG that is under the conductive structure 183 and in the semiconductor layer 14. When the voltage applied to the conductive structure 183 is greater than or equal to a threshold (|V2|≥|Vth|), the doped semiconductor layer 17 may cause presence of the 2DHG under the conductive structure 183. When the voltage applied to the conductive structure 183 is greater than or equal to a threshold (|V2|≥|Vth|), the doped semiconductor layer 17 may cause unblocking of the 2DHG 141 in the semiconductor layer 14.

Figure 3A:
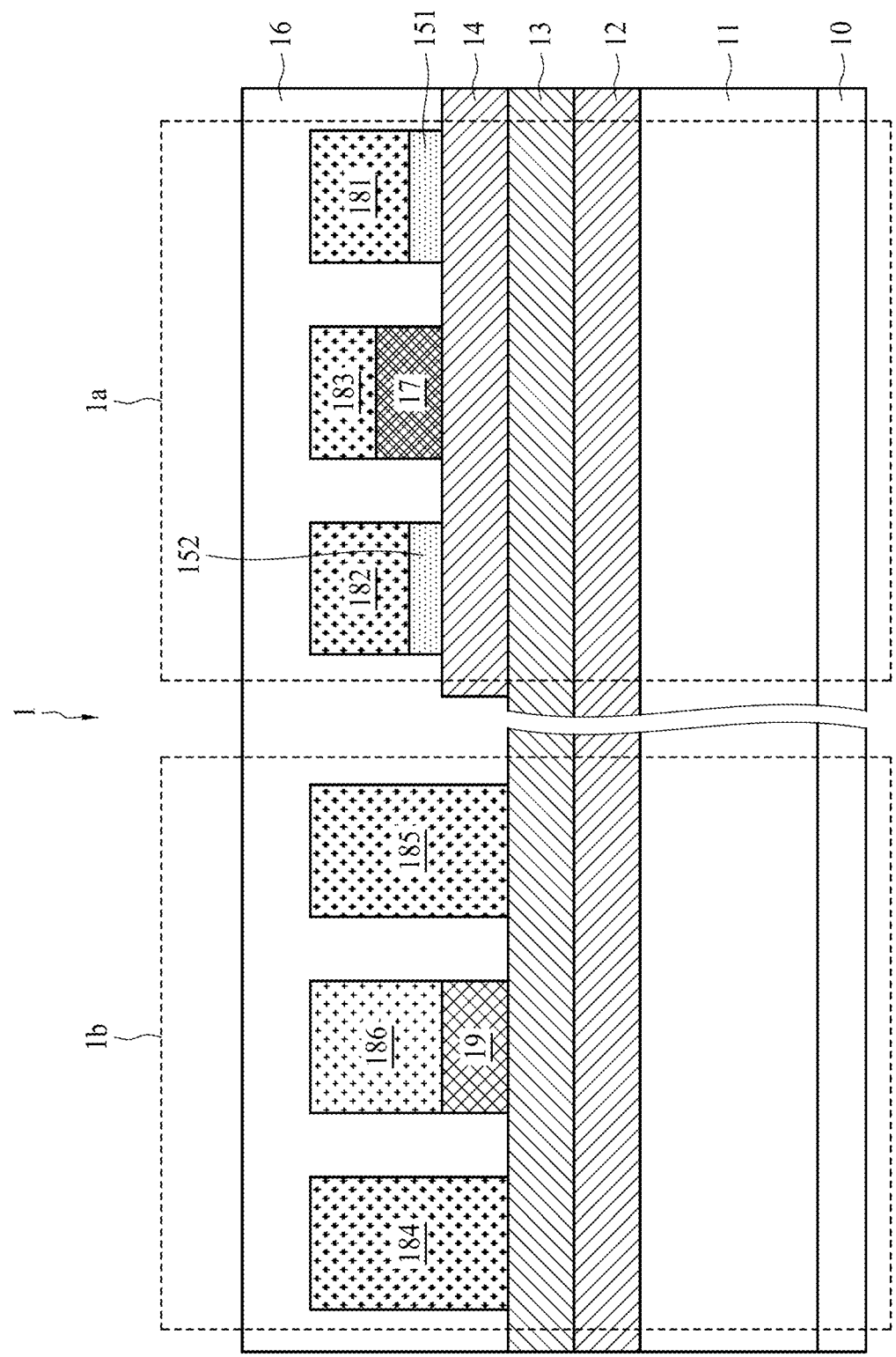
FIG. 3A is a side view of a semiconductor device according to some embodiments of this disclosure.

FIG. 3A is a side view of a semiconductor device according to some embodiments of this disclosure.

As shown in FIG. 3A, the semiconductor device 1 may include a structure 1a and a structure 1b.

The structure 1a may include a substrate 10, a buffer layer 11, a semiconductor layer 12, a semiconductor layer 13, a semiconductor layer 14, a doped semiconductor layer 151, a doped semiconductor layer 152, a passivation layer 16, and a doped semiconductor layer 17, a conductive structure 181, a conductive structure 182, and a conductive structure 183.

In the structure 1a, the semiconductor layer 13 may serve as a barrier layer. In the structure 1a, the semiconductor layer 13 may serve as a barrier layer disposed on the substrate 10, the buffer layer 11, and the semiconductor layer 12.

In the structure 1a, the semiconductor layer 14 may serve as a channel layer. In the structure 1a, the semiconductor layer 14 may serve as a channel layer disposed on the semiconductor layer 13. In the structure 1a, the forbidden band width of the semiconductor layer 14 is smaller than the forbidden band width of the semiconductor layer 13. In the structure 1a, the 2DHG may be formed in the semiconductor layer 14. In the structure 1a, the 2DHG may be formed in the semiconductor layer 14 and close to a junction between the semiconductor layer 13 and the semiconductor layer 14.

In the structure 1a, the doped semiconductor layer 151 may serve as an ohmic contact. In the structure 1a, the doped semiconductor layer 151 may serve as an ohmic contact between the conductive structure 183 and the semiconductor layer 14. In the structure 1a, the doped semiconductor layer 151 may have a different doping polarity than the doped semiconductor layer 17.

In the structure 1a, the doped semiconductor layer 152 may serve as an ohmic contact. In the structure 1a, the doped semiconductor layer 152 may serve as an ohmic contact between the conductive structure 182 and the semiconductor layer 14. In the structure 1a, the doped semiconductor layer 152 may have a different doping polarity than the doped semiconductor layer 17.

In the structure 1a, the passivation layer 16 may be configured to electrically isolate the structure 1a from other semiconductor devices such as, but without limitation, the structure 1b.

In the structure 1a, the doped semiconductor layer 17 may serve as an insert layer. In the structure 1a, the doped semiconductor layer 17 may serve as an insert layer disposed between the semiconductor layer 14 and the conductive structure 183. In the structure 1a, the doped semiconductor layer 17 may deplete the 2DHG in the semiconductor layer 14. In the structure 1a, the doped semiconductor layer 17 may deplete the 2DHG that is in the semiconductor layer 14 and under the conductive structure 183. In the structure 1a, when no voltage is applied to the conductive structure 183, the doped semiconductor layer 17 may cause blocking of the 2DHG in the semiconductor layer 14. In the structure 1a, the doped semiconductor layer 17 may implement an enhancement-mode semiconductor device.

In the structure 1a, the conductive structure 181 may serve as, but without limitation, a source conductor. In the structure 1a, the conductive structure 181 may serve as, but without limitation, a drain conductor.

In the structure 1a, the conductive structure 182 may serve as, but without limitation, a drain conductor. In the structure 1a, the conductive structure 182 may serve as, but without limitation, a source conductor.

In the structure 1a, the conductive structure 183 may serve as a gate conductor. In the structure 1a, the conductive structure 183 may be configured to recover the 2DHG in the semiconductor layer 14. In the structure 1a, a voltage may be applied to the conductive structure 183 to recover the 2DHG in the semiconductor layer 14. In the structure 1a, a voltage may be applied to the conductive structure 183 to recover the 2DHG that is in the semiconductor layer 14 and under the conductive structure 183. In the structure 1a, a voltage may be applied to the conductive structure 183 to control conductivity between the conductive structure 181 and the conductive structure 182.

Still referring to FIG. 3A, the structure 1b may include a substrate 10, a buffer layer 11, a semiconductor layer 12, a semiconductor layer 13, a passivation layer 16, a doped semiconductor layer 19, a conductive structure 184, a conductive structure 185, and a conductive structure 186.

In the structure 1b, the semiconductor layer 12 may serve as a channel layer. In the structure 1b, the semiconductor layer 12 may serve as a channel layer disposed under the semiconductor layer 13. In the structure 1b, the forbidden band width of the semiconductor layer 12 is smaller than the forbidden band width of the semiconductor layer 13. In the structure 1b, a two-dimensional electron gas (2DEG) may be formed in the semiconductor layer 12. In the structure 1b, the 2DEG may be formed in the semiconductor layer 12 and close to a junction between the semiconductor layer 13 and the semiconductor layer 12.

In the structure 1b, the semiconductor layer 13 may serve as a barrier layer. In the structure 1a, the semiconductor layer 13 may serve as a barrier layer disposed on the substrate 10, the buffer layer 11, and the semiconductor layer 12.

In the structure 1b, the passivation layer 16 may be configured to electrically isolate the structure 1b from other semiconductor devices such as, but without limitation, the structure 1a.

The doped semiconductor layer 19 may be disposed on the semiconductor layer 13. The doped semiconductor layer 19 may include a doped category-III-V material. The doped semiconductor layer 19 may include an n-type category- III-V material. The doped semiconductor layer 19 may include, but without limitation, a p-type category-III nitride. The doped semiconductor layer 19 may include, but without limitation, a p-type GaN. The doped semiconductor layer 19 may include, but without limitation, a p-type AlN. The doped semiconductor layer 19 may include, but without limitation, a p-type InN. The doped semiconductor layer 19 may include, but without limitation, a p-type AlGaN. The doped semiconductor layer 19 may include, but without limitation, a p-type InGaN. The doped semiconductor layer 19 may include, but without limitation, a p-type InAlN. When the doped semiconductor layer 19 includes a p-type category-III-V material, the doped material of the doped semiconductor layer 19 may include, but without limitation, at least one of Mg, Zn, or Ca.

The doped semiconductor layer 19 may also include another p-type semiconductor material. The doped semiconductor layer 19 may include, but without limitation, a p-type CuO. The doped semiconductor layer 19 may include, but without limitation, a p-type $NiO_x$. When the doped semiconductor layer 19 includes a p-type CuO, the doped material of the doped semiconductor layer 19 may include, but without limitation, at least one of Mg, Zn, or Ca. When the doped semiconductor layer 19 includes a p-type $NiO_x$, the doped material of the doped semiconductor layer 19 may include, but without limitation, at least one of Mg, Zn, or Ca.

The doped semiconductor layer 19 may have a thickness of approximately 10 nm to approximately 200 nm. The doped semiconductor layer 19 may have a thickness of approximately 50 nm to approximately 150 nm. The doped semiconductor layer 19 may have a thickness of approximately 80 nm to approximately 120 nm. The doped semiconductor layer 19 may have a doping concentration of approximately $10^{17}$ $cm^{-3}$ to approximately $10^{21}$ $cm^{-3}$. The doped semiconductor layer 19 may have a doping concentration of approximately $10^{19}$ $cm^{-3}$ to approximately $10^{21}$ $cm^{-3}$. The doped semiconductor layer 19 may have a doping concentration of approximately $10^{20}$ $cm^{-3}$ to approximately $10^{21}$ $cm^{-3}$. The doping concentration of the doped semiconductor layer 19 may be p-type.

The conductive structure 184 may be disposed on the semiconductor layer 13. The conductive structure 184 may include a metal. The conductive structure 184 may include, but without limitation, aluminum (Al), titanium (Ti), palladium (Pd), nickel (Ni), and tungsten (W). The conductive structure 184 may include a metal compound. The conductive structure 184 may include, but without limitation, titanium nitride (TiN).

The conductive structure 185 may be disposed on the semiconductor layer 13. The conductive structure 185 may include a metal. The conductive structure 185 may include, but without limitation, aluminum (Al), titanium (Ti), palladium (Pd), nickel (Ni), and tungsten (W). The conductive structure 185 may include a metal compound. The conductive structure 185 may include, but without limitation, titanium nitride (TiN).

The conductive structure 186 may be disposed on the semiconductor layer 13. The conductive structure 186 may be disposed on the doped semiconductor layer 19 so that the doped semiconductor layer 19 is located between the semiconductor layer 13 and the conductive structure 186.

The conductive structure 186 may include a metal. The conductive structure 186 may include, but without limitation, gold (Au), platinum (Pt), titanium (Ti), palladium (Pd), nickel (Ni), and tungsten (W). The conductive structure 186 may include a metal compound. The conductive structure 186 may include, but without limitation, titanium nitride (TiN).

In the structure 1b, the conductive structure 184 may serve as, but without limitation, a source conductor. In the structure 1b, the conductive structure 184 may serve as, but without limitation, a drain conductor.

In the structure 1b, the conductive structure 185 may serve as, but without limitation, a drain conductor. In the structure 1b, the conductive structure 184 may serve as, but without limitation, a source conductor.

In the structure 1b, the conductive structure 186 may serve as a gate conductor. In the structure 1b, the conductive structure 186 may be configured to control the 2DEG in the semiconductor layer 12. In the structure 1b, a voltage may be applied to the conductive structure 186 to control the 2DEG in the semiconductor layer 12. In the structure 1b, a voltage may be applied to the conductive structure 186 to control the 2DEG that is in the semiconductor layer 12 and under the conductive structure 186. In the structure 1b, a voltage may be applied to the conductive structure 186 to control conductivity or blocking between the conductive structure 184 and the conductive structure 185.

In some embodiments, the conductive structure 184 may serve as a source conductor of the semiconductor device. The conductive structure 185 may serve as a drain conductor of the semiconductor device. The conductive structure 186 may serve as a gate conductor of the semiconductor device. The conductive structure 184 usable as a source conductor and the conductive structure 185 usable as a drain conductor are separately disposed on two sides of the conductive structure 186 usable as a gate conductor in FIG. 3A, but the conductive structure 184, the conductive structure 185, and the conductive structure 186 may have different configurations in other embodiments of this disclosure depending on design requirements.

Still referring to FIG. 3A, the structure 1a may serve as a p-channel semiconductor device. The structure 1a may serve as a p-channel field effect transistor. The structure 1a may serve as an enhancement-mode p-channel field effect transistor. The structure 1b may serve as an n-channel semiconductor device. The structure 1b may serve as an n-channel field effect transistor. The structure 1b may serve as an enhancement-mode n-channel field effect transistor. The structure 1a and the structure 1b may form a CMOS device. The structure 1a and the structure 1b may form a CMOS device made of a category-III-V material. The structure 1a and the structure 1b may form an enhancement-mode CMOS device made of a category-III-V material.

Figure 3B:
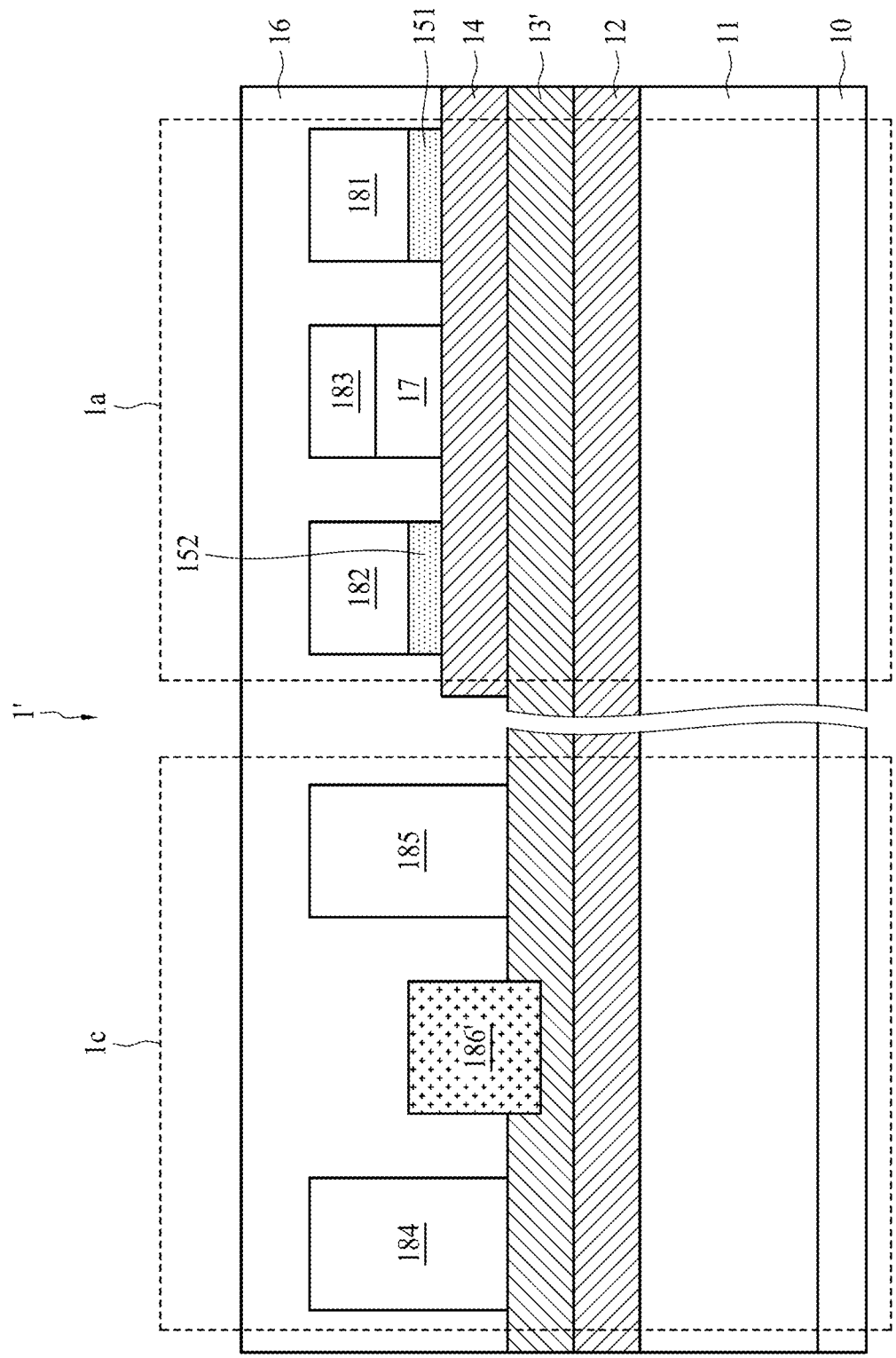
FIG. 3B is a side view of a semiconductor device according to some embodiments of this disclosure.

FIG. 3B is a side view of a semiconductor device according to some embodiments of this disclosure.

A semiconductor device 1' shown in FIG. 3B is similar to the semiconductor device 1 shown in FIG. 3A, but differs in that the semiconductor layer 13 shown in FIG. 3A is replaced by a semiconductor layer 13', the conductive structure 186 shown in FIG. 3A is replaced by a conductive structure 186', and the doped semiconductor layer 19 shown in FIG. 3A is eliminated. The conductive structure 186' may have a structure identical or similar to that of the conductive structure 186. The semiconductor layer 13' may have a structure similar to that of the semiconductor layer 13.

The semiconductor device 1' may include a structure 1a and a structure 1c.

In the structure 1c, the semiconductor layer 13' may be disposed on the semiconductor layer 12. In the structure 1c, the semiconductor layer 13' may be disposed between the semiconductor layer 12 and the conductive structure 186'. In the structure 1c, the semiconductor layer 13' may directly contact the conductive structure 186'. In the structure 1c, the semiconductor layer 13' may have a recess. The semiconductor layer 13' may have a recess for accommodating the conductive structure 186'. In the structure 1c, the semiconductor layer 13' may have a recessed region. The semiconductor layer 13' may have a recessed region for accommodating the conductive structure 186'.

The conductive structure 186' may be disposed on the semiconductor layer 13'. The conductive structure 186' may be surrounded by the semiconductor layer 13'. The conductive structure 186' may be encircled by the semiconductor layer 13'.

In the structure 1c, the conductive structure 186' may serve as a gate conductor. In the structure 1c, the conductive structure 186' may be configured to control the 2DEG in the semiconductor layer 12. In the structure 1c, a voltage may be applied to the conductive structure 186' to control the 2DEG in the semiconductor layer 12. In the structure 1c, a voltage may be applied to the conductive structure 186' to control the 2DEG that is in the semiconductor layer 12 and under the conductive structure 186'. In the structure 1c, a voltage may be applied to the conductive structure 186' to control conductivity or blocking between the conductive structure 184 and the conductive structure 185.

Still referring to FIG. 3B, the structure 1a may serve as a p-channel semiconductor device. The structure 1a may serve as a p-channel field effect transistor. The structure 1a may serve as an enhancement-mode p-channel field effect transistor. The structure 1c may serve as an n-channel semiconductor device. The structure 1c may serve as an n-channel field effect transistor. The structure 1c may serve as an enhancement-mode n-channel field effect transistor. The structure 1a and the structure 1c may form a CMOS device. The structure 1a and the structure 1c may form a CMOS device made of a category-III-V material. The structure 1a and the structure 1c may form an enhancement-mode CMOS device made of a category-III-V material.

Figure 3C:
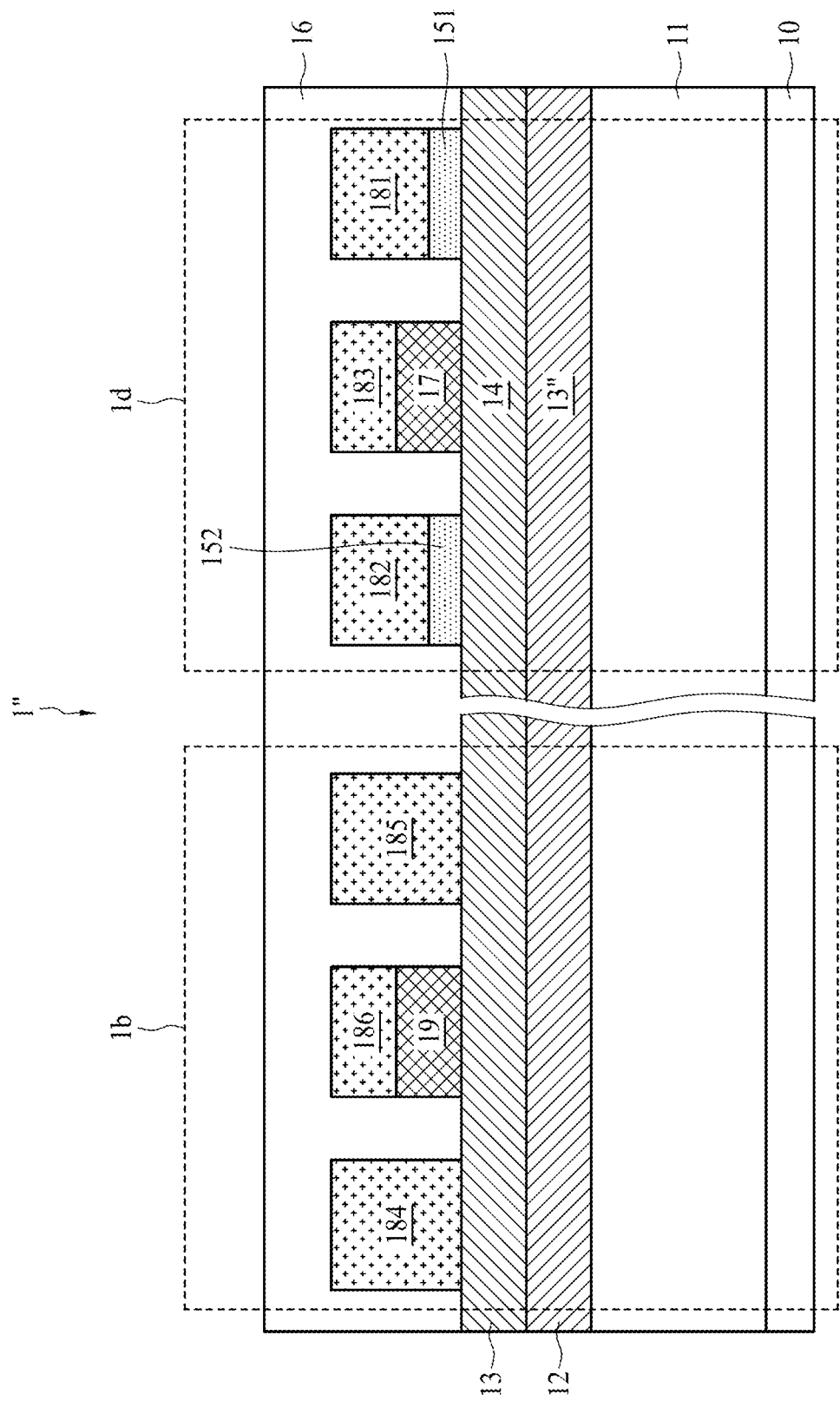
FIG. 3C is a side view of a semiconductor device according to some embodiments of this disclosure.

FIG. 3C is a side view of a semiconductor device according to some embodiments of this disclosure.

A semiconductor device 1" shown in FIG. 3C is similar to the semiconductor device 1 shown in FIG. 3A, but differs in that the semiconductor layer 13 of the structure 1a shown in FIG. 3A is replaced by a semiconductor layer 13", and the semiconductor layer 12 shown in FIG. 3A is eliminated.

The semiconductor device 1" may include a structure 1b and a structure 1d.

In the structure 1d, the semiconductor layer 13" may be disposed on the buffer layer 11. In the structure 1d, the semiconductor layer 13" may be directly disposed on the buffer layer 11. In the structure 1d, the semiconductor layer 13" may be disposed between the buffer layer 11 and the semiconductor layer 14.

In the semiconductor device 1", the structure 1b and the structure 1d may have a same level. In the semiconductor device 1", the structure 1b and the structure 1d may be substantially on a same elevation.

Still referring to FIG. 3C, the structure 1d may serve as a p-channel semiconductor device. The structure 1d may serve as a p-channel field effect transistor. The structure 1d may serve as an enhancement-mode p-channel field effect transistor. The structure 1b may serve as an n-channel semiconductor device. The structure 1b may serve as an n-channel field effect transistor. The structure 1b may serve as an enhancement-mode n-channel field effect transistor. The structure 1d and the structure 1b may form a CMOS device. The structure 1d and the structure 1b may form a CMOS device made of a category-III-V material. The structure 1d and the structure 1b may form an enhancement-mode CMOS device made of a category-III-V material.

FIG. 4A, FIG. 4B, FIG. 4C, FIG. 4D, FIG. 4E, FIG. 4F, and FIG. 4G illustrate several operations of fabricating a semiconductor device according to some embodiments of this disclosure.

FIG. 4A, FIG. 4B, FIG. 4C, FIG. 4D, and FIG. 4E illustrate several operations for fabricating the semiconductor device 1 shown in FIG. 3A, but similar operations can be used to fabricate the semiconductor device 1" shown in FIG. 3C.

Figure 4A:
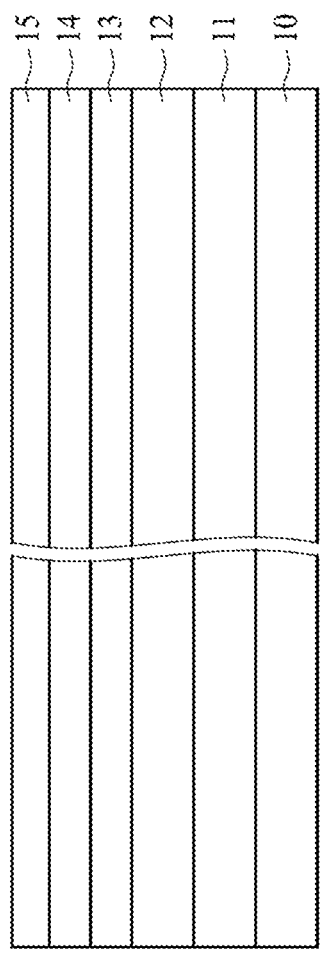

Referring to FIG. 4A, a substrate 10 is provided. In some embodiments, a buffer layer 11 is disposed on the substrate 10. In some embodiments, the buffer layer 11 may be formed through chemical vapor deposition (CVD) and/or another appropriate deposition step. In some embodiments, the buffer layer 11 may be formed on the substrate 10 through CVD and/or another appropriate deposition step.

In some embodiments, a semiconductor layer 12 is disposed on the buffer layer 11. In some embodiments, the semiconductor layer 12 may be formed through CVD and/or another appropriate deposition step. In some embodiments, the semiconductor layer 12 may be formed on the buffer layer 11 through CVD and/or another appropriate deposition step.

In some embodiments, a semiconductor layer 13 is disposed on the semiconductor layer 12. In some embodiments, the semiconductor layer 13 may be formed through CVD and/or another appropriate deposition step. In some embodiments, the semiconductor layer 13 may be formed on the semiconductor layer 12 through CVD and/or another appropriate deposition step. It should be noted that the semiconductor layer 13 may be formed after the semiconductor layer 12. It should be noted that a heterojunction may be formed after the semiconductor layer 13 is disposed on the semiconductor layer 12. It should be noted that a bandgap of the formed semiconductor layer 13 may be larger than that of the formed semiconductor layer 12. It should be noted that due to polarization of the heterojunction formed between the semiconductor layer 13 and the semiconductor layer 12, 2DEG may be formed in the semiconductor layer 12 that has a relatively small bandgap. It should be noted that due to polarization of the heterojunction formed between the semiconductor layer 13 and the semiconductor layer 12, 2DEG may be formed in the semiconductor layer 12 with a relatively small bandgap and close to a junction between the semiconductor layer 12 and the semiconductor layer 13.

In some embodiments, a semiconductor layer 14 is disposed on the semiconductor layer 13. In some embodiments, the semiconductor layer 14 may be formed through CVD and/or another appropriate deposition step. In some embodiments, the semiconductor layer 14 may be formed on the semiconductor layer 13 through CVD and/or another appropriate deposition step. It should be noted that the semiconductor layer 14 may be formed after the semiconductor layer 13. It should be noted that a heterojunction may be formed after the semiconductor layer 14 is disposed on the semiconductor layer 13. It should be noted that a bandgap of the formed semiconductor layer 14 may be smaller than that of the formed semiconductor layer 13. It should be noted that due to polarization of the heterojunction formed between the semiconductor layer 14 and the semiconductor layer 13, 2DHG may be formed in the semiconductor layer 14 that has a relatively small bandgap. It should be noted that due to polarization of the heterojunction formed between the semiconductor layer 14 and the semiconductor layer 13, 2DHG may be formed in the semiconductor layer 14 with a relatively small bandgap and close to a junction between the semiconductor layer 14 and the semiconductor layer 13.

In some embodiments, a semiconductor layer 15 is disposed on the semiconductor layer 14. In some embodiments, the semiconductor layer 15 may be formed through CVD and/or another appropriate deposition step. In some embodiments, the semiconductor layer 15 may be formed on the semiconductor layer 14 through CVD and/or another appropriate deposition step.

Figure 4B:
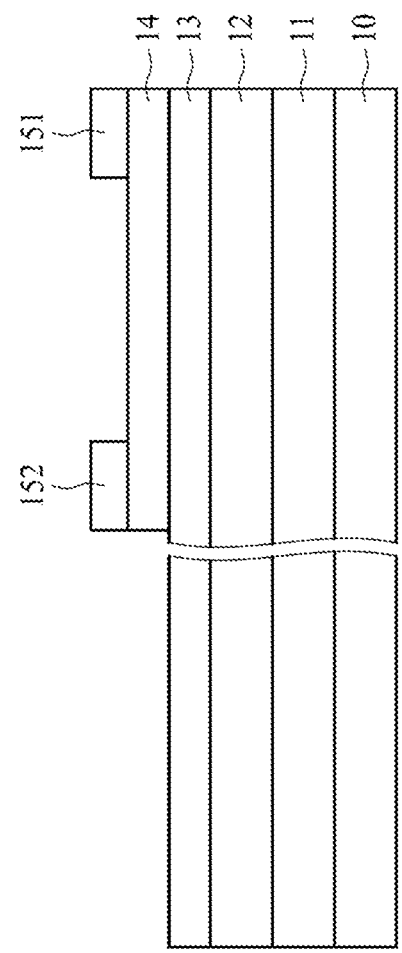

Referring to FIG. 4B, the doped semiconductor layer 151 may be formed on the semiconductor layer 14. In some embodiments, the doped semiconductor layer 151 may be formed by ion implantation. In some embodiments, the doped semiconductor layer 151 may be formed by implanting, but without limitation, a p-type dopant. In some embodiments, the doped semiconductor layer 151 may be formed by implanting, but without limitation, another dopant. In some embodiments, the doped semiconductor layer 151 may be formed by implanting, but without limitation, a p-type dopant into the semiconductor layer 15 shown in FIG. 4A. In some embodiments, the doped semiconductor layer 151 may be formed by implanting, but without limitation, another dopant into the semiconductor layer 15 shown in FIG. 4A. In some embodiments, the doped semiconductor layer 151 may be formed by thermal diffusion. In some embodiments, the doped semiconductor layer 151 may be formed by thermally diffusing, but without limitation, a p-type dopant. In some embodiments, the doped semiconductor layer 151 may be formed by thermally diffusing, but without limitation, another dopant. In some embodiments, the doped semiconductor layer 151 may be formed by thermally diffusing, but without limitation, a p-type dopant into the semiconductor layer 15 shown in FIG. 4A. In some embodiments, the doped semiconductor layer 151 may be formed by thermally diffusing, but without limitation, another dopant into the semiconductor layer 15 shown in FIG. 4A.

Still referring to FIG. 4B, the doped semiconductor layer 152 may be formed on the semiconductor layer 14. In some embodiments, the doped semiconductor layer 152 may be formed by ion implantation. In some embodiments, the doped semiconductor layer 152 may be formed by implanting, but without limitation, a p-type dopant. In some embodiments, the doped semiconductor layer 152 may be formed by implanting, but without limitation, another dopant. In some embodiments, the doped semiconductor layer 152 may be formed by implanting, but without limitation, a p-type dopant into the semiconductor layer 15 shown in FIG. 4A. In some embodiments, the doped semiconductor layer 152 may be formed by implanting, but without limitation, another dopant into the semiconductor layer 15 shown in FIG. 4A. In some embodiments, the doped semiconductor layer 152 may be formed by thermal diffusion. In some embodiments, the doped semiconductor layer 152 may be formed by thermally diffusing, but without limitation, a p-type dopant. In some embodiments, the doped semiconductor layer 152 may be formed by thermally diffusing, but without limitation, another dopant. In some embodiments, the doped semiconductor layer 152 may be formed by thermally diffusing, but without limitation, a p-type dopant into the semiconductor layer 15 shown in FIG. 4A. In some embodiments, the doped semiconductor layer 152 may be formed by thermally diffusing, but without limitation, another dopant into the semiconductor layer 15 shown in FIG. 4A.

Still referring to FIG. 4B, a part of the semiconductor layer 15 (not shown in FIG. 4B) may be removed. In some embodiments, a part of the semiconductor layer 15 may be removed by, for example, a yellow light lithography process. In some embodiments, a part of the semiconductor layer 15 may be removed by etching. In some embodiments, a part of the semiconductor layer 15 may be removed to form a doped semiconductor layer 151 and a doped semiconductor layer 152. In some embodiments, a part of the semiconductor layer 15 may be removed by etching to form a doped semiconductor layer 151 and a doped semiconductor layer 152.

Still referring to FIG. 4B, a part of the semiconductor layer 14 may be removed. In some embodiments, a part of the semiconductor layer 14 may be removed by, for example, a yellow light lithography process. In some embodiments, a part of the semiconductor layer 14 may be removed by etching.

Referring to FIG. 4C, a passivation layer 16 may be formed through a deposition step. In some embodiments, the passivation layer 16 may be deposited on the semiconductor layer 13. In some embodiments, the passivation layer 16 may be deposited on the semiconductor layer 13 through CVD and/or another appropriate deposition step. In some embodiments, the passivation layer 16 may be deposited on the semiconductor layer 14. In some embodiments, the passivation layer 16 may be deposited on the semiconductor layer 14 through CVD and/or another appropriate deposition step. In some embodiments, the passivation layer 16 may be deposited on the doped semiconductor layer 151. In some embodiments, the passivation layer 16 may be deposited on the doped semiconductor layer 151 through CVD and/or another appropriate deposition step. In some embodiments, the passivation layer 16 may be deposited on the doped semiconductor layer 152. In some embodiments, the passivation layer 16 may be deposited on the doped semiconductor layer 152 through CVD and/or another appropriate deposition step.

Still referring to FIG. 4C, the doped semiconductor layer 17 may be formed on the semiconductor layer 14. The doped semiconductor layer 19 may be formed on the semiconductor layer 14 and surrounded by the passivation layer 16. The doped semiconductor layer 17 may be formed on the semiconductor layer 14 and encircled by the passivation layer 16. The doped semiconductor layer 17 may be formed on the semiconductor layer 14 through a deposition step. In some embodiments, the doped semiconductor layer 17 may be formed on the semiconductor layer 14 through CVD and/or another appropriate deposition step.

Still referring to FIG. 4C, in some embodiments, the doped semiconductor layer 17 may be formed by ion implantation. In some embodiments, the doped semiconductor layer 17 may be formed by implanting, but without limitation, an n-type dopant. In some embodiments, the doped semiconductor layer 17 may be formed by implanting, but without limitation, another dopant. In some embodiments, the doped semiconductor layer 17 may be formed by thermal diffusion. In some embodiments, the doped semiconductor layer 17 may be formed by thermally diffusing, but without limitation, an n-type dopant. In some embodiments, the doped semiconductor layer 17 may be formed by thermally diffusing, but without limitation, another dopant. It should be noted that the doped semiconductor layer 17 may have an opposite doping type against the doped semiconductor layer 151. For example, the doped semiconductor layer 17 may have an n-type dopant, and the doped semiconductor layer 151 may have a p-type dopant. It should be noted that the doped semiconductor layer 17 may have an opposite doping type against the doped semiconductor layer 152. For example, the doped semiconductor layer 17 may have an n-type dopant, and the doped semiconductor layer 152 may have a p-type dopant.

Referring to FIG. 4D, a part of the passivation layer 16 may be removed. In some embodiments, a part of the passivation layer 16 may be removed by, for example, a yellow light lithography process. In some embodiments, a part of the passivation layer 16 may be removed by etching.

Still referring to FIG. 4D, the doped semiconductor layer 19 may be formed on the semiconductor layer 13. The doped semiconductor layer 19 may be formed on the semiconductor layer 13 and surrounded by the passivation layer 16. The doped semiconductor layer 19 may be formed on the semiconductor layer 13 and encircled by the passivation layer 16. The doped semiconductor layer 19 may be formed on the semiconductor layer 13 through a deposition step. In some embodiments, the doped semiconductor layer 19 may be formed on the semiconductor layer 13 through CVD and/or another appropriate deposition step.

Still referring to FIG. 4D, in some embodiments, the doped semiconductor layer 19 may be formed by ion implantation. In some embodiments, the doped semiconductor layer 19 may be formed by implanting, but without limitation, a p-type dopant. In some embodiments, the doped semiconductor layer 19 may be formed by implanting, but without limitation, another dopant. In some embodiments, the doped semiconductor layer 19 may be formed by thermal diffusion. In some embodiments, the doped semiconductor layer 19 may be formed by thermally diffusing, but without limitation, a p-type dopant. In some embodiments, the doped semiconductor layer 19 may be formed by thermally diffusing, but without limitation, another dopant. It should be noted that the doped semiconductor layer 19 may have an opposite doping type against the doped semiconductor layer 17. For example, the doped semiconductor layer 19 may have a p-type dopant, and the doped semiconductor layer 19 may have an n-type dopant.

Figure 4E:
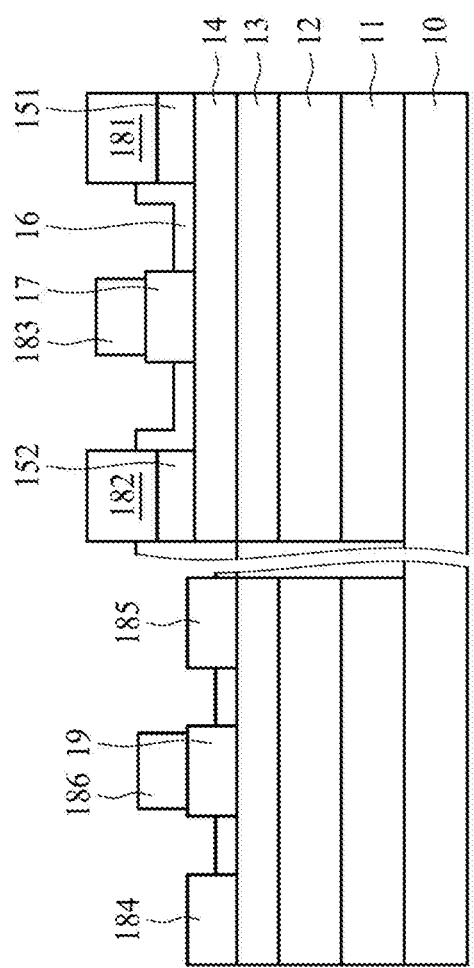

Referring to FIG. 4E, a part of the passivation layer 16 may be removed. In some embodiments, a part of the passivation layer 16 may be removed by, for example, a yellow light lithography process. In some embodiments, a part of the passivation layer 16 may be removed by etching.

Still referring to FIG. 4E, the conductive structure 181 may be formed on the doped semiconductor layer 151. In some embodiments, the conductive structure 181 may be formed on the doped semiconductor layer 151 as a result of removing the part of the passivation layer 16. In some embodiments, the conductive structure 181 may be formed through CVD, physical vapor deposition (PVD), atomic layer deposition (ALD), plating, and/or another appropriate step. In some embodiments, the conductive structure 181 may be formed on the doped semiconductor layer 151 through PVD and/or another appropriate deposition step.

Still referring to FIG. 4E, the conductive structure 182 may be formed on the doped semiconductor layer 152. In some embodiments, the conductive structure 182 may be formed on the doped semiconductor layer 152 as a result of removing the part of the passivation layer 16. In some embodiments, the conductive structure 182 may be formed through CVD, PVD, ALD, plating, and/or another appropriate step. In some embodiments, the conductive structure 182 may be formed on the doped semiconductor layer 152 through PVD and/or another appropriate deposition step.

Still referring to FIG. 4E, the conductive structure 183 may be formed on the doped semiconductor layer 17. In some embodiments, the conductive structure 183 may be formed through CVD, PVD, ALD, plating, and/or another appropriate step. In some embodiments, the conductive structure 183 may be formed on the doped semiconductor layer 17 through PVD and/or another appropriate deposition step.

Still referring to FIG. 4E, the conductive structure 184 may be formed on the semiconductor layer 13. In some embodiments, the conductive structure 184 may be formed on the semiconductor layer 13 as a result of removing the part of the passivation layer 16. In some embodiments, the conductive structure 184 may be formed through CVD, PVD, ALD, plating, and/or another appropriate step. In some embodiments, the conductive structure 184 may be formed on the semiconductor layer 13 through PVD and/or another appropriate deposition step.

Still referring to FIG. 4E, the conductive structure 185 may be formed on the semiconductor layer 13. In some embodiments, the conductive structure 185 may be formed on the semiconductor layer 13 as a result of removing the part of the passivation layer 16. In some embodiments, the conductive structure 185 may be formed through CVD, PVD, ALD, plating, and/or another appropriate step. In some embodiments, the conductive structure 185 may be formed on the semiconductor layer 13 through PVD and/or another appropriate deposition step.

Still referring to FIG. 4E, the conductive structure 186 may be formed on the doped semiconductor layer 19. In some embodiments, the conductive structure 186 may be formed through CVD, PVD, ALD, plating, and/or another appropriate step. In some embodiments, the conductive structure 186 may be formed on the doped semiconductor layer 19 through PVD and/or another appropriate deposition step.

FIG. 4A, FIG. 4B, FIG. 4C, FIG. 4F, and FIG. 4G illustrate several operations for fabricating the semiconductor device 1' shown in FIG. 3B, but similar operations can be used to fabricate the semiconductor device 1" shown in FIG. 3C.

The operations shown in FIG. 4A, FIG. 4B, and FIG. 4C have been described above.

Figure 4F:
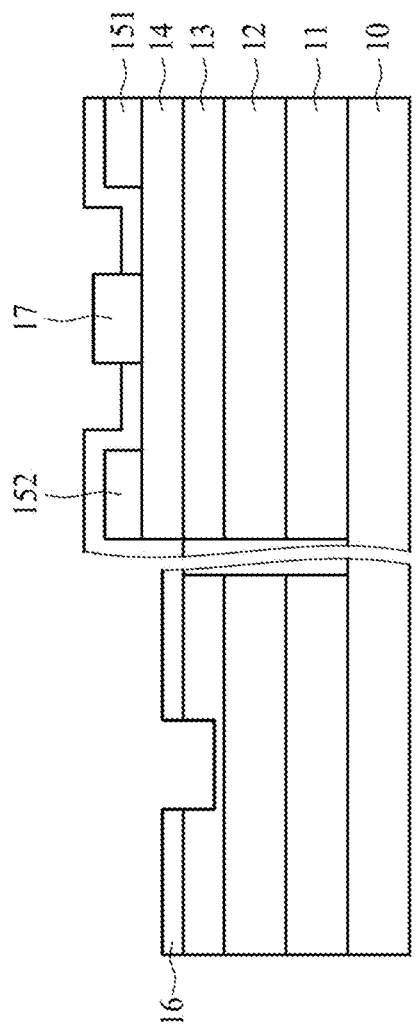

Referring to FIG. 4F, a part of the passivation layer 16 may be removed. In some embodiments, a part of the passivation layer 16 may be removed by, for example, a yellow light lithography process. In some embodiments, a part of the passivation layer 16 may be removed by etching.

Still referring to FIG. 4F, a part of the semiconductor layer 13 may be removed. In some embodiments, a part of the semiconductor layer 13 may be removed by, for example, a yellow light lithography process. In some embodiments, a part of the semiconductor layer 13 may be removed by etching.

Still referring to FIG. 4F, in some embodiments, the semiconductor layer 13 with a part removed may have a recess. In some embodiments, the semiconductor layer 13 with a part removed may have a recessed region. In some embodiments, the semiconductor layer 13 with a part removed and the passivation layer 16 with a part removed may have a recess. In some embodiments, the semiconductor layer 13 with a part removed and the passivation layer 16 with a part removed may have a recessed region.

Figure 4G:
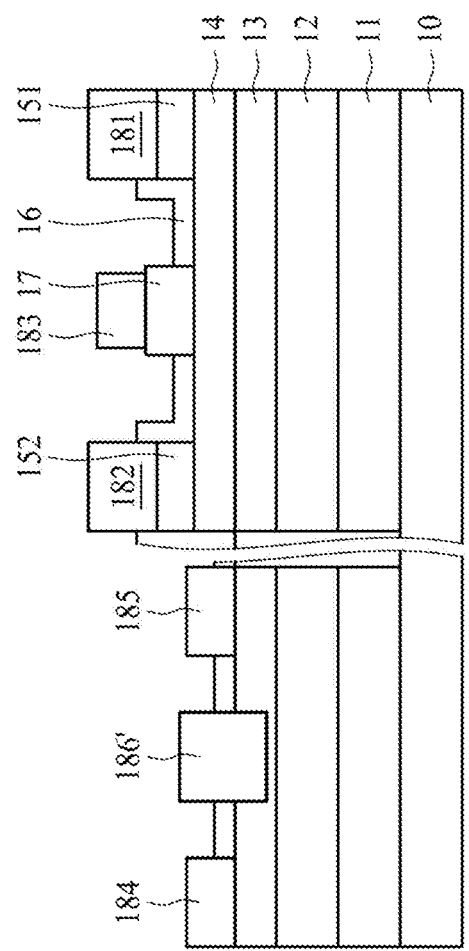

Referring to FIG. 4G, a part of the passivation layer 16 may be removed. In some embodiments, a part of the passivation layer 16 may be removed by, for example, a yellow light lithography process. In some embodiments, a part of the passivation layer 16 may be removed by etching.

Still referring to FIG. 4G, the conductive structure 181 may be formed on the doped semiconductor layer 151. In some embodiments, the conductive structure 181 may be formed on the doped semiconductor layer 151 as a result of removing the part of the passivation layer 16. In some embodiments, the conductive structure 181 may be formed through CVD, PVD, ALD, plating, and/or another appropriate step. In some embodiments, the conductive structure 181 may be formed on the doped semiconductor layer 151 through PVD and/or another appropriate deposition step.

Still referring to FIG. 4G, the conductive structure 182 may be formed on the doped semiconductor layer 152. In some embodiments, the conductive structure 182 may be formed on the doped semiconductor layer 152 as a result of removing the part of the passivation layer 16. In some embodiments, the conductive structure 182 may be formed through CVD, PVD, ALD, plating, and/or another appropriate step. In some embodiments, the conductive structure 182 may be formed on the doped semiconductor layer 152 through PVD and/or another appropriate deposition step.

Still referring to FIG. 4G, the conductive structure 183 may be formed on the doped semiconductor layer 17. In some embodiments, the conductive structure 183 may be formed through CVD, PVD, ALD, plating, and/or another appropriate step. In some embodiments, the conductive structure 183 may be formed on the doped semiconductor layer 17 through PVD and/or another appropriate deposition step.

Still referring to FIG. 4G, the conductive structure 184 may be formed on the semiconductor layer 13. In some embodiments, the conductive structure 184 may be formed on the semiconductor layer 13 as a result of removing the part of the passivation layer 16. In some embodiments, the conductive structure 184 may be formed through CVD, PVD, ALD, plating, and/or another appropriate step. In some embodiments, the conductive structure 184 may be formed on the semiconductor layer 13 through PVD and/or another appropriate deposition step.

Still referring to FIG. 4G, the conductive structure 185 may be formed on the semiconductor layer 13. In some embodiments, the conductive structure 185 may be formed on the semiconductor layer 13 as a result of removing the part of the passivation layer 16. In some embodiments, the conductive structure 185 may be formed through CVD, PVD, ALD, plating, and/or another appropriate step. In some embodiments, the conductive structure 185 may be formed on the semiconductor layer 13 through PVD and/or another appropriate deposition step.

Still referring to FIG. 4G, the conductive structure 186' may be formed on the semiconductor layer 13. In some embodiments, the conductive structure 186' may be formed through CVD, PVD, ALD, plating, and/or another appropriate step. In some embodiments, the conductive structure 186' may be formed on the semiconductor layer 13 through PVD and/or another appropriate deposition step. In some embodiments, the conductive structure 186' may be formed in a recess of the semiconductor layer 13. In some embodiments, the conductive structure 186' may be formed in the recess of the semiconductor layer 13 through PVD and/or another appropriate deposition step. In some embodiments, the conductive structure 186' may be formed in a recessed region of the semiconductor layer 13. In some embodiments, the conductive structure 186' may be formed in a recessed region of the semiconductor layer 13 through PVD and/or another appropriate deposition step.

Still referring to FIG. 4G, the formed conductive structure 186' may be surrounded by the semiconductor layer 13. In some embodiments, the formed conductive structure 186' may be encircled by the semiconductor layer 13'.

As used herein, space-related terms such as "under", "below", "lower portion", "above", "upper portion", "lower portion", "left side", "right side", and the like may be used herein to simply describe a relationship between one element or feature and another element or feature as shown in the figures. In addition to orientation shown in the figures, space-related terms are intended to encompass different orientations of the device in use or operation. An apparatus may be oriented in other ways (rotated 90 degrees or at other orientations), and the space-related descriptors used herein may also be used for explanation accordingly. It should be understood that when a component is "connected" or "coupled" to another component, the component may be directly connected or coupled to another component, or an intermediate component may exist.

As used in the present application, terms "approximately", "essentially", "substantially", and "about" are used for describing and considering a small variation. When being used in combination with an event or circumstance, the term may refer to a case in which the event or circumstance occurs precisely, and a case in which the event or circumstance occurs approximately. As used herein with respect to a given value or range, the term "about" generally means in the range of ±10%, ±5%, ±1%, or ±0.5% of the given value or range. The range may be indicated herein as from one endpoint to another endpoint or between two endpoints. Unless otherwise specified, all ranges disclosed herein include endpoints. The term "substantially coplanar" may refer to positioning along the same plane within a few micrometers (μm), such as two surfaces within 10 μm, within 5 μm, within 1 μm, or within 0.5 μm located along the same plane. When reference is made to "substantially" the same numerical value or characteristic, the term may refer to a value within ±10%, ±5%, ±1%, or ±0.5% of the average of the values.

Several embodiments of this disclosure and features of details are briefly described above. The embodiments described in this disclosure may be easily used as a basis for designing or modifying other processes and structures for realizing the same or similar objectives and/or obtaining the same or similar advantages introduced in the embodiments of the present invention. Such equivalent construction does not depart from the spirit and scope of this disclosure, and various variations, replacements, and modifications can be made without departing from the spirit and scope of this disclosure.

What is claimed is:

1. A semiconductor device, comprising:
   a substrate;
   a barrier layer, disposed on the substrate;
   a first channel layer, disposed on the barrier layer;
   a first gate conductor, disposed on the first channel layer;
   a first doped semiconductor layer, disposed between the first gate conductor and the first channel layer;
   wherein a forbidden band width of the barrier layer is greater than a forbidden band width of the first channel layer;
   a first source conductor;
   a first ohmic contact, located between the first source conductor and the first channel layer;
   wherein the first ohmic contact comprises a p-type category-III-V layer;
   a first drain conductor;
   a second ohmic contact, located between the first drain conductor and the first channel layer;

wherein the second ohmic contact comprises a p-type category-III-V layer;
a second channel layer, disposed between the substrate and the barrier layer;
a second gate conductor, located on the barrier layer;
a second doped semiconductor layer, disposed between the second gate conductor and the barrier layer;
wherein a forbidden band width of the barrier layer is greater than a forbidden band width of the second channel layer;
a second source conductor, disposed on the barrier layer; and
a second drain conductor, disposed on the barrier layer, wherein the second drain conductor is electrically connected to the first drain conductor.

2. The semiconductor device according to claim 1, wherein the first doped semiconductor layer comprises an n-type semiconductor material.

3. The semiconductor device according to claim 2, wherein the first doped semiconductor layer comprises either an n-type $Ga_2O_3$ or an n-type SiC.

4. The semiconductor device according to claim 2, wherein the first doped semiconductor layer comprises an n-type category-III-V material.

5. The semiconductor device according to claim 4, wherein the first doped semiconductor layer comprises one of: an n-type AlN, an n-type GaN, an n-type InN, an n-type AlGaN, an n-type InGaN, an n-type InAlN, or an n-type AlInGaN.

6. The semiconductor device according to claim 1, wherein the first doped semiconductor layer has a thickness of approximately 5 nm to approximately 200 nm.

7. The semiconductor device according to claim 1, wherein the first doped semiconductor layer has a doping concentration of approximately $10^{17}$ cm$^{-3}$ to approximately $10^{21}$ cm$^{-3}$.

8. The semiconductor device according to claim 1, wherein
a two-dimensional hole gas (2DHG) is formed in the first channel layer and close to a junction between the barrier layer and the first channel layer.

9. The semiconductor device according to claim 1, wherein
the barrier layer comprises a first category-III-V material, and the first category-III-V layer comprises AlGaN.

10. The semiconductor device according to claim 9, wherein
the first channel layer comprises a second category-III-V layer, and the second category-III-V layer comprises GaN.

11. The semiconductor device according to claim 1, wherein the second doped semiconductor layer comprises an p-type semiconductor material.

\* \* \* \* \*